US008478086B2

(12) United States Patent
Zheng

(10) Patent No.: US 8,478,086 B2
(45) Date of Patent: Jul. 2, 2013

(54) IMAGING LASER DIODES WITH A LIGHTWAVE CIRCUIT

(75) Inventor: Ruizhi Zheng, Shanghai (CN)

(73) Assignee: Eastman Kodak Company, Rochester, NY (US)

( * ) Notice: Subject to any disclaimer, the term of this patent is extended or adjusted under 35 U.S.C. 154(b) by 125 days.

(21) Appl. No.: 13/038,688

(22) Filed: Mar. 2, 2011

(65) Prior Publication Data

US 2012/0224802 A1 Sep. 6, 2012

(51) Int. Cl.
*G02B 6/12* (2006.01)
*G02B 6/10* (2006.01)

(52) U.S. Cl.
USPC ................. 385/14; 385/11; 385/33; 385/129; 385/130; 385/132

(58) Field of Classification Search
USPC ............... 385/14, 129, 130, 131, 132, 88, 89, 385/31, 33, 34, 11, 44, 45
See application file for complete search history.

(56) References Cited

U.S. PATENT DOCUMENTS

| | | | | |
|---|---|---|---|---|
| 5,517,359 | A | 5/1996 | Gelbart | |
| 6,945,708 | B2 * | 9/2005 | Crafts et al. | 385/89 |
| 7,261,982 | B2 | 8/2007 | Fondeur et al. | |
| 7,313,157 | B2 * | 12/2007 | Sorin et al. | 372/50.1 |
| 2003/0142946 | A1 | 7/2003 | Saito et al. | |
| 2003/0214991 | A1 | 11/2003 | Wiedmann et al. | |
| 2004/0151227 | A1 * | 8/2004 | Bhowmik et al. | 372/97 |
| 2006/0133730 | A1 * | 6/2006 | Shin et al. | 385/37 |
| 2007/0223552 | A1 * | 9/2007 | Muendel et al. | 372/50.12 |
| 2008/0273829 | A1 | 11/2008 | Saida et al. | |
| 2010/0272385 | A1 | 10/2010 | Akiyama | |
| 2012/0224802 | A1 * | 9/2012 | Zheng | 385/14 |

FOREIGN PATENT DOCUMENTS

| | | | |
|---|---|---|---|
| EP | 0 636 908 | A1 | 2/1995 |
| EP | 1 788 678 | A1 | 5/2007 |

* cited by examiner

*Primary Examiner* — Brian Healy
(74) *Attorney, Agent, or Firm* — Nelson Adrian Blish

(57) ABSTRACT

An apparatus for imaging light from a plurality of laser diodes (504) onto a multi-channel light valve (6) includes a plurality of laser diodes each coupled to at least one fiber waveguide (508). A planar lightwave circuit (408) is coupled to at least one waveguide on a first side (508), and to the multi-planar light valve (6) on a second side.

7 Claims, 7 Drawing Sheets

420
404
418
416
412
408

IMAGING LASER DIODES WITH A LIGHTWAVE CIRCUIT

CROSS REFERENCE TO RELATED APPLICATIONS

Reference is made to commonly-assigned U.S. patent application Ser. No. 13/038,702 (now U.S. Publication No. 2012/0224803), filed Mar. 2, 2011, entitled IMAGING LASER DIODES WITH A LIGHTWAVE CIRCUIT, by Zheng; the disclosure of which is incorporated herein.

FIELD OF THE INVENTION

The present invention relates to multi-channel modulators in general and in particular to connecting individually addressable multi-element laser diodes to the modulator with a planar lightwave circuit.

BACKGROUND OF THE INVENTION

In order to increase the power and data rates available from laser diodes, multi-element, individually addressable arrays of laser diodes are sometimes used. These can be of the diffraction-limited single-mode type or arrays of broad area emitters. The broad area emitters are diffraction-limited in one dimension, referred to as the "narrow" dimension and act as a wide area source in the other or "wide" dimension.

The advantage of the broad area emitters, also referred to as "stripe" laser diodes, is the much higher output power possible. Because of this high power, these devices are manufactured with their positive side bonded to a heat sink since the thermal conductivity of the substrate material is much lower than that of the heat sink. Since the connections to the individual diodes also have to come out of the positive side, there is a conflict and a compromise between the heat sinking needs and the interconnections.

U.S. Pat. No. 5,517,359 (Gelbart) depicts an apparatus for imaging light from a laser diode onto a multi-channel linear light valve. FIG. 1 shows a high power laser, wide emission area, laser diode 1 which emits a light beam 2 which is collimated in the vertical dimension by a cylindrical micro-lens 3. A second micro-lens 4 is a linear array of cylindrical lenslet arrays 4' aligned with the multiple emitters l' of laser diode 1. The light from cylindrical lenslet arrays 4' is collimated by cylindrical lens 5 and imaged as a line on linear light valve 6.

When a high power laser is used, linear light valve 6 is a polarized lead zirconiom titanate (PLZT) device, causing the state of the polarization of the light to rotate when a voltage is applied to electrodes on the PLZT material. A polarizer prism 7 transmits the light of horizontal polarization and reflects the polarized light 11 with polarization changed by passing through the activated PLZT cells. An imaging lens 8 images linear light valve 6 onto heat sensitive or on light sensitive material 9, forming an image 10. Image 10 is a reduced image of the linear light valve 6.

The part designated as light pipe 104 in FIG. 1, shows an area where light propagates from lenslet array 4 in the direction of light valve 6. The light emitted from emitters l' through light pipe 104 may lose uniformity when it reaches light valve 6. An apparatus which overcomes the problem described above would be desirable.

SUMMARY OF THE INVENTION

Briefly, according to one aspect of the present invention an apparatus for imaging light from a plurality of laser diodes onto a multi-channel light valve includes a plurality of laser diodes each coupled to at least one fiber waveguide. A planar lightwave circuit (PLC) is couple to at least one waveguide on a first side, and to the multi-planar light valve on a second side.

These and other objects, features, and advantages of the present invention will become apparent to those skilled in the art upon a reading of the following detailed description when taken in conjunction with the drawings wherein there is shown and described an illustrative embodiment of the invention.

DETAILED DESCRIPTION OF THE INVENTION

Figure 1:
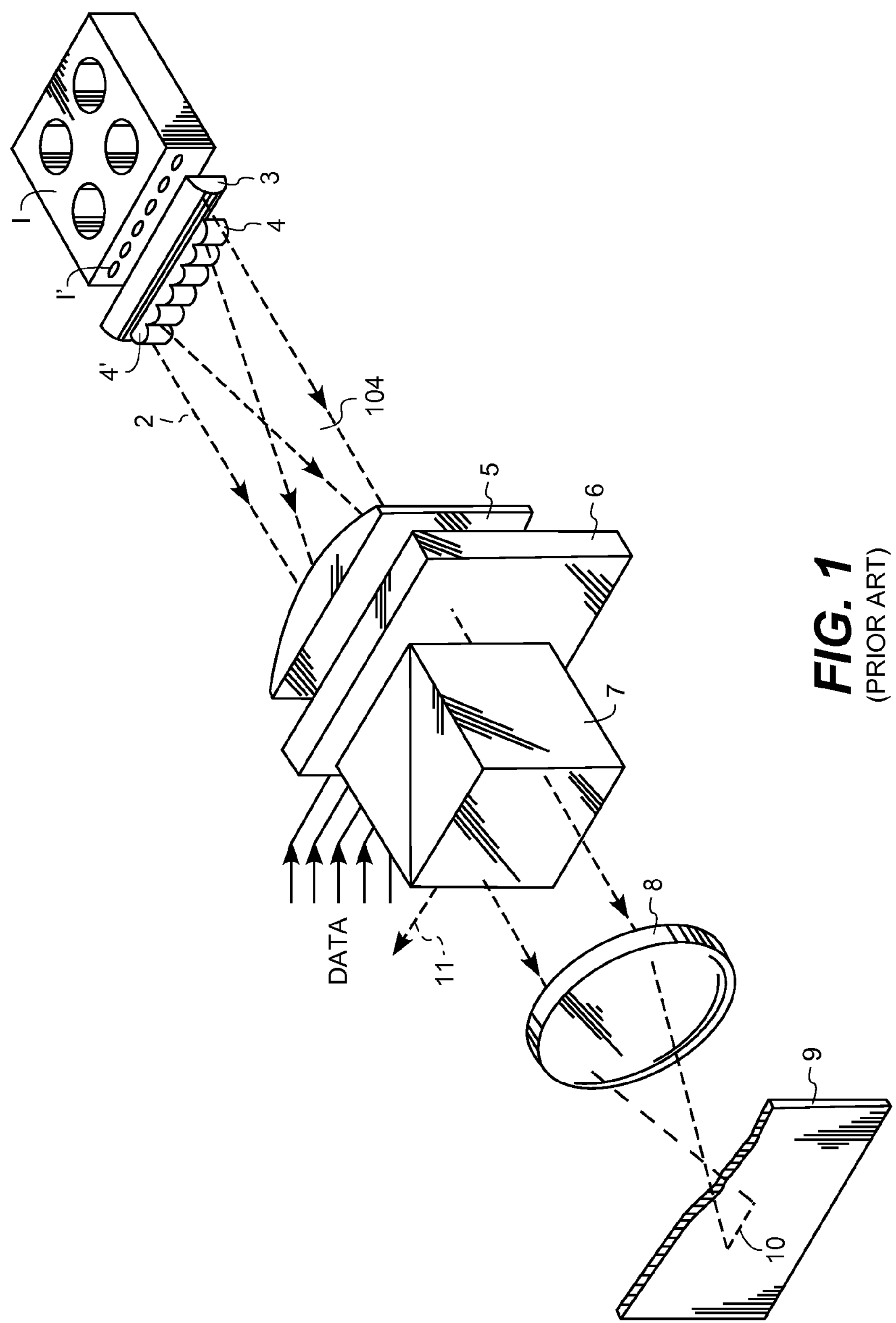
FIG. 1 is a prior art perspective view of a thermal head structure.
Figure 2:
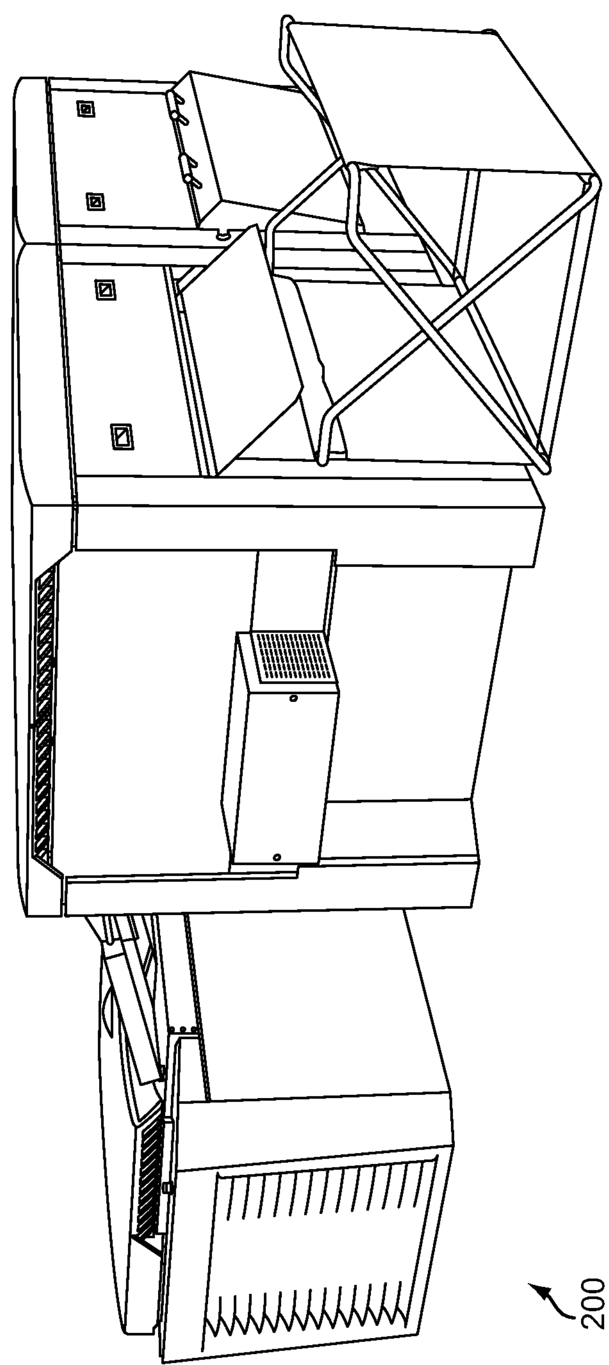
FIG. 2 is a prior art schematic view of a computer-to-plate (CTP) device.
Figure 3:
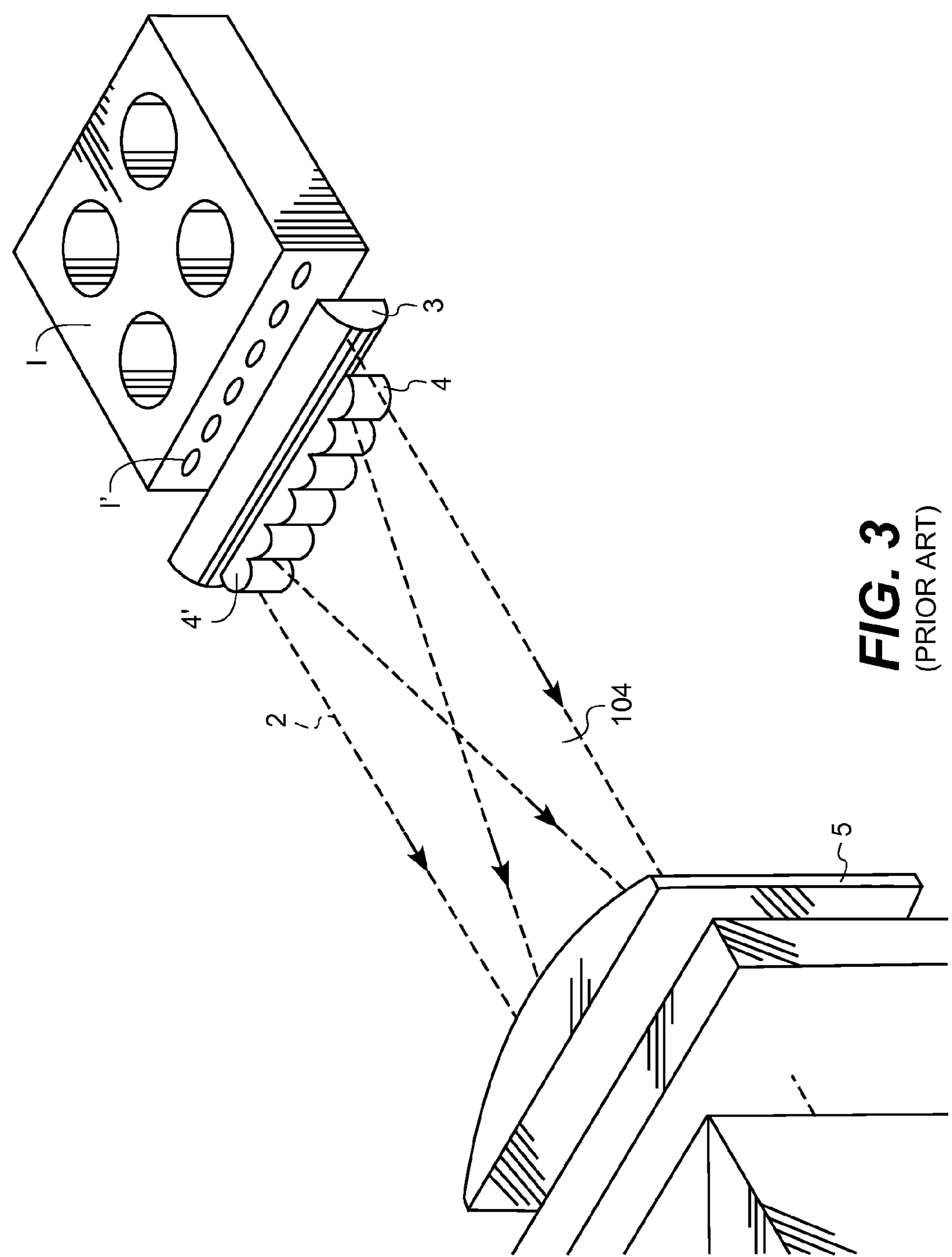
FIG. 3 is a prior art perspective view of the part of the thermal head structure to be replaced by this invention.

The present invention describes an imaging head of a laser processing system which is part of a computer-to-plate (CTP) imaging device 200 shown in FIG. 2. FIG. 3 shows the main part of the imaging head which is replaced by this invention.

The structure of light pipe 104 described in U.S. Pat. No. 5,517,359 causes a non-uniform distribution of power laser array that results in imaging artifacts on imaging material 9. An improvement to the light pipe 104 is accomplished by using a planar lightwave circuit (PLC), shown in FIG. 4. The PLC 408 referred in this invention is a structure based on optical waveguides to form a light combiner structure 412 and a light splitter structure. The structures could be implemented by for example ridge, channel or photonic crystal waveguides and replaces several of the components in pipe 104, providing a light pipe arrangement that improves the uniformity of the light emitted from the laser source.

Figure 4:
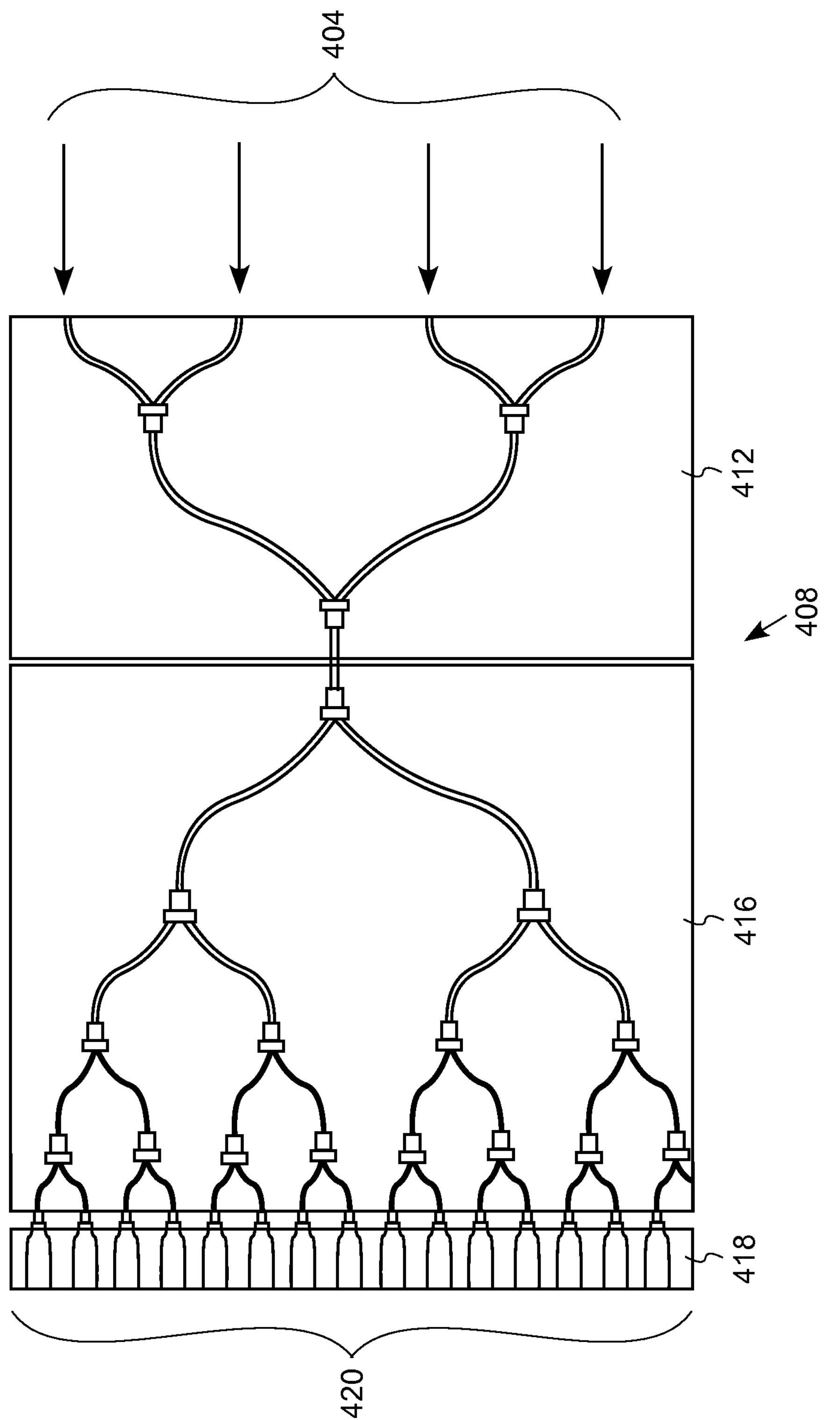
FIG. 4 is a schematic view of the part of the thermal head using a planar lightwave circuit (PLC)

FIG. 4 shows PLC 408. The PLC 408 includes a fiber waveguide structure to form an emission combiner element 412. The combiner element 412 is configured to receive light emitted by laser source arrangement through inlets 404. The received light is then combined by combiner element 412 and further split by splitter element 416 into plurality of outlets 420 via outlet waveguides 418. Outlets 420 are coupled to light valve 6. Each of the outlets 420 are selected or deselected by light valve 6 according to image data (not shown) thus forming an image on imaging material 9. The number of inlets 404 used is dependent upon the total power required for imaging.

Figure 5:
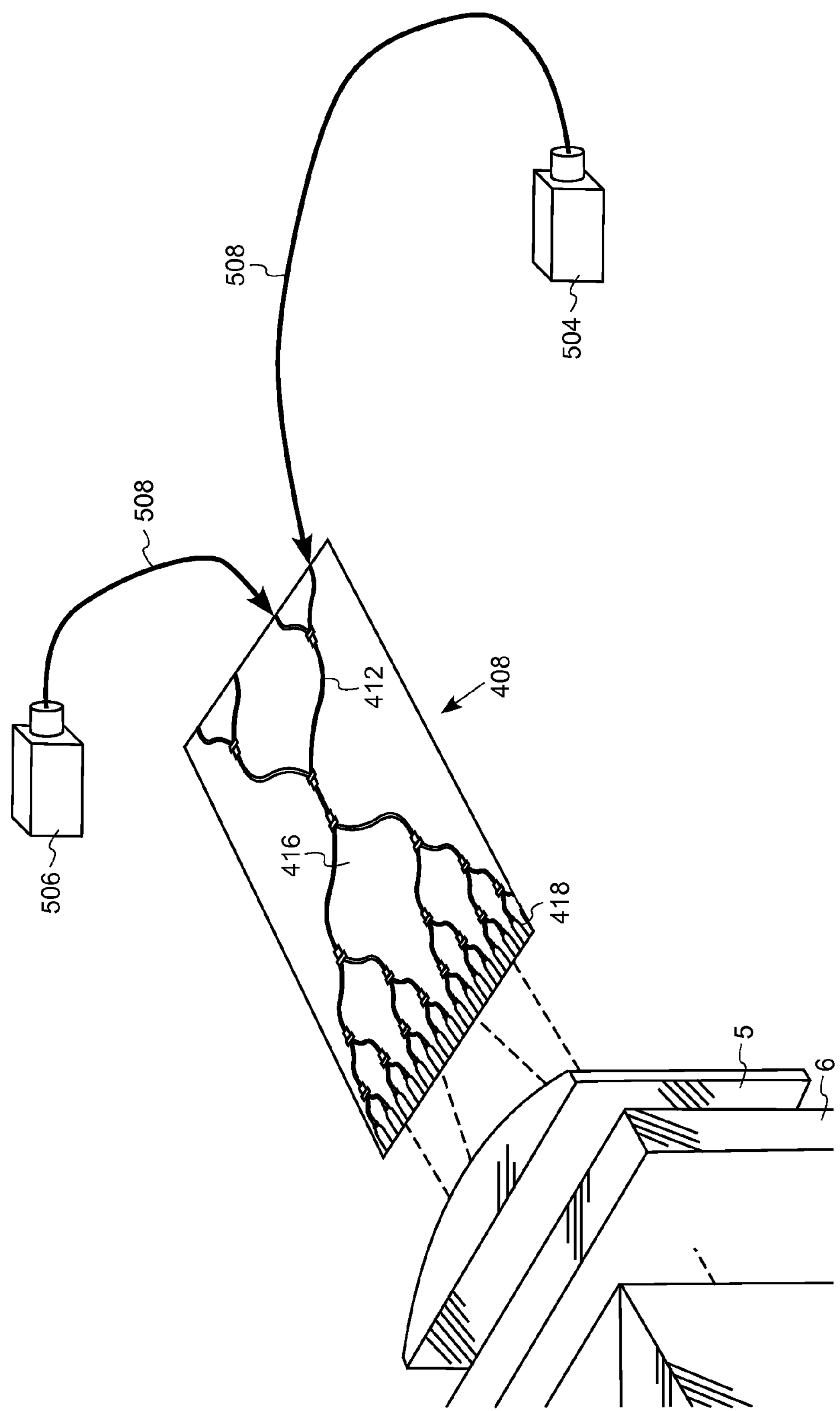
FIG. 5 is a perspective view of a thermal head structure with an integrated PLC configured to guide the emitted light from emitters to the light valve, the light source are laser diodes.

FIG. 5 depicts several single high-power laser diodes (LDs) 504. The laser diodes 504 are coupled to fiber waveguides 508, which are further coupled to inlets 404 of PLC 408. The fiber waveguides 508 may be a single mode fiber, multi-mode fiber or polarization maintained fiber. The laser diodes 504 replace laser diode bar 1 which is used in U.S. Pat. No. 5,517,359. The number of laser diodes 504 used, depends upon the total imaging power requirement. The arrangement shown in FIG. 4 and FIG. 5 limits the need for cylindrical lenslet array 4' (in prior art). The laser output guided through PLC 408 provides a naturally uniform and non collimated light before entering into light valve 6.

Figure 6:
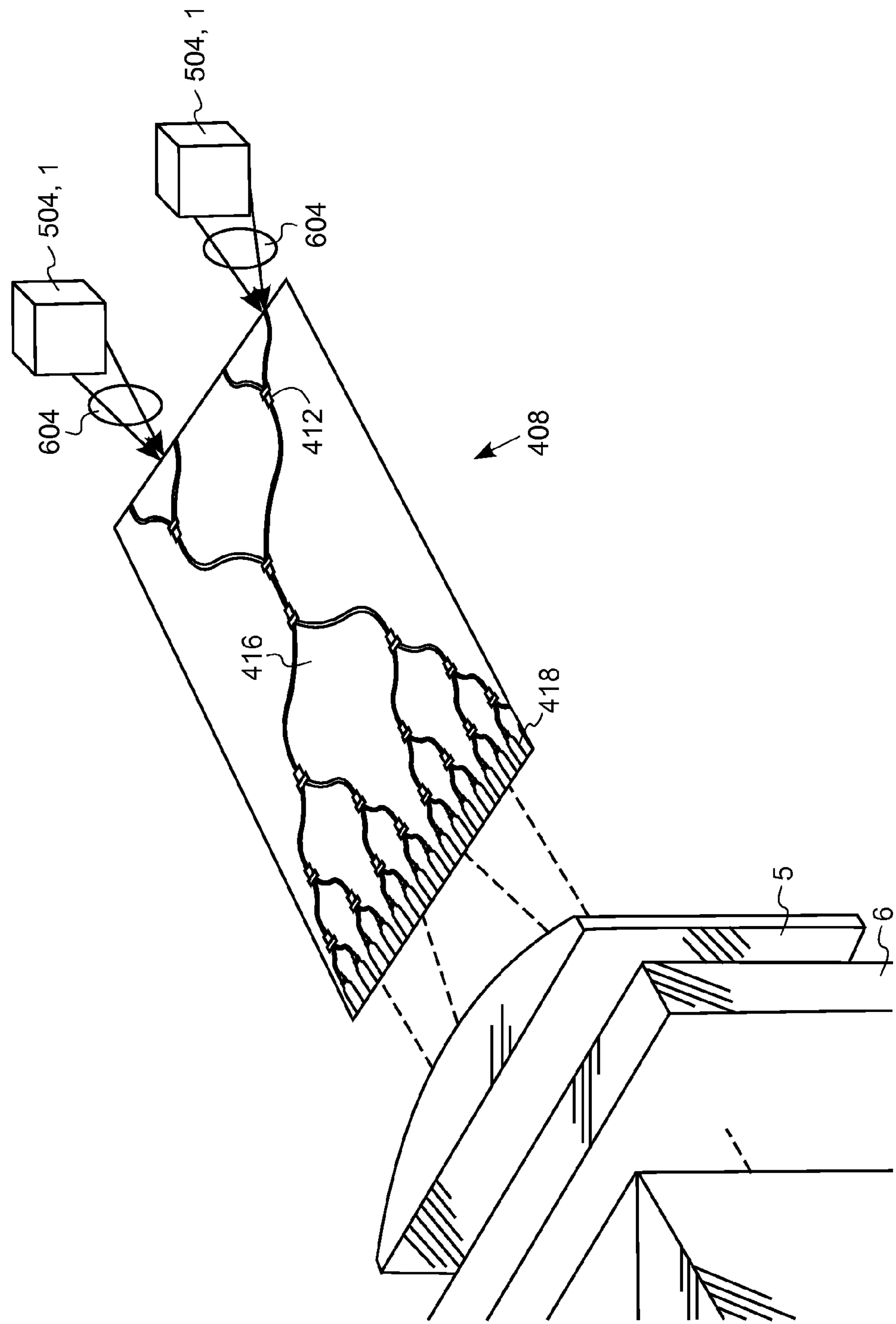
FIG. 6 is a perspective view of a thermal head structure with an integrated PLC configured to guide the emitted light from emitters to the light valve, the light sources are laser diode bars.
Figure 7:
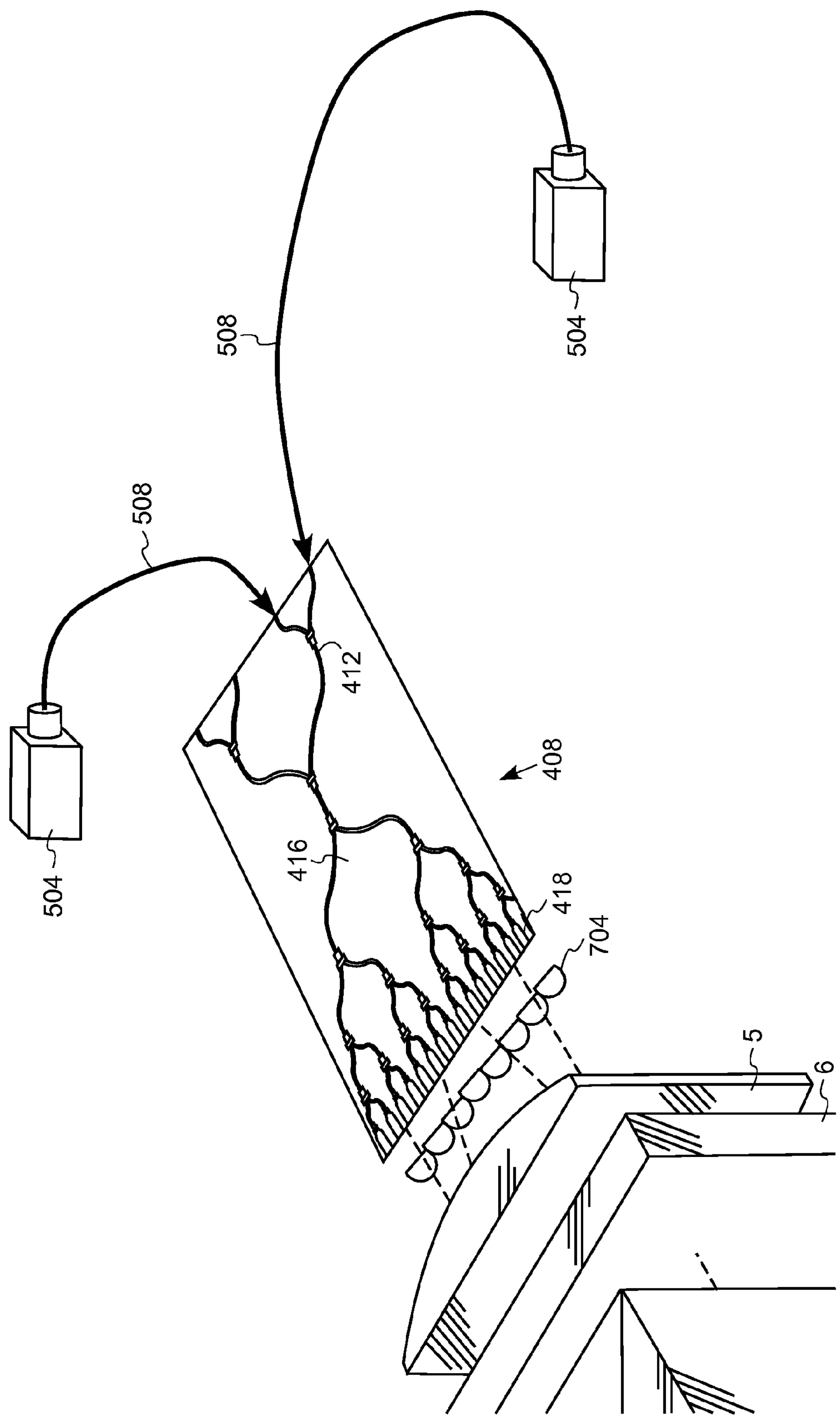
FIG. 7 is a perspective view of a thermal head structure with an integrated PLC and a lens array attached to the PLC outlet for reshaping of the beam profile entering into the light valve.

FIG. 6 shows single laser diode or laser diode array coupled into a PLC combiner/splitter 408 by a micro-lens or micro-lens array 604. FIG. 7 shows a PLC combiner/splitter 408 emitting light onto the direction of a light valve 6. The emitted light is reshaped by a lens array 704.

The invention has been described in detail with particular reference to certain preferred embodiments thereof, but it will be understood that variations and modifications can be effected within the scope of the invention.

PARTS LIST

1 laser diode
1' emitters
2 light beam
3 cylindrical micro-lens
4 micro-lens
4' cylindrical lenslet array
5 cylindrical lens
6 light valve
7 polarizer prism
8 imaging lens
9 imaging material
10 image formed
11 polarized light
104 light pipe
200 imaging system (laser processing system)
404 inlets for laser diode source
408 planar lightwave circuit (PLC)
412 combiner element
416 splitter element
418 outlet waveguides
420 outlet from PLC into light valve
504 laser diode
508 fiber waveguides
604 micro-lens or micro-lens array
704 lens array

The invention claimed is:

1. A system for imaging light from a printhead onto a printing plate comprising:

a plurality of laser diodes;

a planar lightwave circuit (PLC) having a plurality of inlets on a first side, each inlet connected to a laser diode comprising:

a combiner that receives light from the plurality of inlets and combines the light from the plurality of inlets;

a splitter that receives light from the combiner and splits the light into a plurality of outlet waveguides;

directing light from each of the plurality of waveguides on a multi-channel light valve and wherein said outlet waveguides are selected or deselected by said multi-channel light valve according to image data; and creating an image on the printing plate with the light valve.

2. The system of claim 1 wherein the plurality of laser diodes are coupled to the first side of the PLC via at least one fiber waveguide and wherein each of the at least one fiber waveguide is coupled to the one inlet of the PLC.

3. The system of claim 2 wherein the fiber waveguide is selected from a group consisting of single mode fiber, multi-mode fiber, and polarization maintained fiber.

4. The system of claim 1 wherein the plurality of laser diodes are coupled to the first side of the PLC through a micro-lens.

5. The system of claim 1 wherein the plurality of laser diodes are coupled to the first side of the PLC through a micro-lens array.

6. The system of claim 1 wherein the PLC is coupled directly to the light valve.

7. The system of claim 1 wherein the PLC is coupled to the light valve through a lens array.

* * * * *